United States Patent
Fishburn et al.

(10) Patent No.: US 7,368,372 B2
(45) Date of Patent: May 6, 2008

(54) METHODS OF FABRICATING MULTIPLE SETS OF FIELD EFFECT TRANSISTORS

(75) Inventors: Fred D. Fishburn, Boise, ID (US); Martin Ceredig Roberts, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 11/386,167

(22) Filed: Mar. 21, 2006

(65) Prior Publication Data

US 2006/0166445 A1    Jul. 27, 2006

Related U.S. Application Data

(60) Continuation of application No. 10/914,822, filed on Aug. 9, 2004, now Pat. No. 7,067,378, which is a division of application No. 10/323,453, filed on Dec. 18, 2002, now Pat. No. 6,927,135.

(51) Int. Cl.
  *H01L 21/3205*  (2006.01)
  *H01L 21/4763*  (2006.01)
  *H01L 21/8236* (2006.01)

(52) U.S. Cl. .............. 438/587; 438/941; 438/230; 257/E21.623; 257/E21.637

(58) Field of Classification Search ............... 438/587, 438/592, 230, 253, 239, 241, 278, 275, 941; 257/E21.623, E21.637
See application file for complete search history.

(56) References Cited

U.S. PATENT DOCUMENTS

| | | | |
|---|---|---|---|
| 5,232,863 A | 8/1993 | Roberts | |
| 5,317,197 A | 5/1994 | Roberts | |
| 5,385,866 A | 1/1995 | Bartush | |
| 5,648,357 A | 7/1997 | Bianco et al. | |
| 5,923,584 A | 7/1999 | Roberts et al. | |
| 5,942,450 A | 8/1999 | Song | |
| 5,948,700 A | 9/1999 | Zheng et al. | |
| 6,033,963 A | 3/2000 | Huang et al. | |
| 6,066,567 A | 5/2000 | En et al. | |
| 6,074,908 A | 6/2000 | Huang | |
| 6,200,892 B1 | 3/2001 | Roberts et al. | |
| 6,204,143 B1 | 3/2001 | Roberts et al. | |
| 6,214,715 B1 | 4/2001 | Huang et al. | |
| 6,242,334 B1 | 6/2001 | Huang | |
| 6,258,729 B1 | 7/2001 | DeBoer et al. | |
| 6,432,768 B1 | 8/2002 | Chien et al. | |
| 6,465,351 B1 | 10/2002 | Jeong | |
| 6,509,235 B2 | 1/2003 | Chien et al. | |
| 6,518,131 B1 | 2/2003 | Lim | |
| 6,531,728 B2 | 3/2003 | DeBoer et al. | |

(Continued)

*Primary Examiner*—Walter Lindsay, Jr.
(74) *Attorney, Agent, or Firm*—Well St. John P.S.

(57) ABSTRACT

The invention includes methods of fabricating multiple sets of field effect transistors. In one implementation, an etch stop layer is formed over an insulative capping layer which is formed over a conductive gate layer formed over a substrate. The etch stop layer, the insulative capping layer, and the conductive gate layer are patterned and etched to form a first set of conductive gate constructions over the substrate. A dielectric material is formed and planarized over the first set of gate constructions. Thereafter, the insulative capping layer and the conductive gate layer are patterned and etched to form a second set of conductive gate constructions over the substrate. Other aspects and implementations are contemplated.

30 Claims, 9 Drawing Sheets

U.S. PATENT DOCUMENTS

| | | |
|---|---|---|
| 6,534,414 B1 | 3/2003 | Wang et al. |
| 6,548,357 B2 | 4/2003 | Weybright et al. |
| 6,596,632 B2 | 7/2003 | Roberts et al. |
| 6,740,573 B2 | 5/2004 | Roberts et al. |
| 7,067,378 B2 * | 6/2006 | Fishburn et al. ............ 438/275 |
| 2001/0000760 A1 | 5/2001 | Roberts et al. |
| 2002/0110966 A1 | 8/2002 | Lee |
| 2002/0115249 A1 | 8/2002 | Seo et al. |
| 2003/0017657 A1 | 1/2003 | Han |
| 2005/0009278 A1 | 1/2005 | Fishburn et al. |
| 2005/0009280 A1 | 1/2005 | Fishburn et al. |

* cited by examiner

METHODS OF FABRICATING MULTIPLE SETS OF FIELD EFFECT TRANSISTORS

RELATED PATENT DATA

This patent resulted from a continuation application of U.S. patent application Ser. No. 10/914,822, filed Aug. 9, 2004, entitled "Methods of Fabricating Multiple Sets of Field Effect Transistors", naming Fred D. Fishburn and M. Ceredig Roberts as inventors, now U.S. Pat. No. 7,067,378, the disclosure of which is incorporated by reference; which patent resulted from a divisional application of U.S. patent application Ser. No. 10/323,453, filed Dec. 18, 2002, entitled "Methods of Fabricating Multiple Sets of Field Effect Transistors", naming Fred D. Fishburn and M. Ceredig Roberts as inventors, now U.S. Pat. No. 6,927,135 B2, the disclosure of which is incorporated by reference.

TECHNICAL FIELD

This invention relates to methods of fabricating multiple sets of field effect transistors.

BACKGROUND OF THE INVENTION

One type of circuitry device is a field effect transistor. Typically, such includes opposing semiconductive material source/drain regions of one conductivity type having a semiconductive channel region of opposite conductivity type therebetween. A gate construction is received proximate the channel region between the source/drain regions. The gate construction typically includes a conductive region and a thin dielectric layer positioned between the conductive region and the channel region. Current can be caused to flow between the source/drain regions through the channel region by applying a suitable voltage to the conductive portion of the gate.

In certain fabrication methods, different sets of field effect transistors are fabricated at different times. For example in CMOS circuitry, different conductivity-type transistors are fabricated. It is common for the different types of transistors to be fabricated separately, or at least partially at different times, to provide the desired conductivity-type and dopant concentrations for the respective transistors. For example in some such instances, a common conductive gate layer is separately masked and exposed on different areas of the wafer for fabricating the desired gates at different times and locations on the wafer for the different conductivity-type transistors.

The most common technique still utilized today for transistor gate fabrication is photolithography and etch. The ever-reducing size of the device components is resulting in an increase in the vertical heights of the etched devices as compared to their widths, something referred to as "aspect ratio". It is highly desirable that the width/critical dimension of the smallest features be controlled in the given photomasking and etching steps such that it is constant over the substrate. Yet, differing topography across the wafer when fabricating the gate stacks for transistors can result in less than desired control and consistency in device critical dimension which are fabricated over the wafer in the same masking step.

The invention was principally motivated in addressing the above-described issues and problems, although it is in no way so limited. The artisan will appreciate the applicability of the invention outside of the environment in which the invention was motivated. The invention is only limited by the accompanying claims as literally worded, without interpretative or other limiting reference to the specification, and in accordance with the doctrine of equivalents.

SUMMARY

The invention includes methods of fabricating multiple sets of field effect transistors. In one implementation, an etch stop layer is formed over an insulative capping layer which is formed over a conductive gate layer formed over a substrate. The etch stop layer, the insulative capping layer, and the conductive gate layer are patterned and etched to form a first set of conductive gate constructions over the substrate. A dielectric material is formed and planarized over the first set of gate constructions. Thereafter, the insulative capping layer and the conductive gate layer are patterned and etched to form a second set of conductive gate constructions over the substrate.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
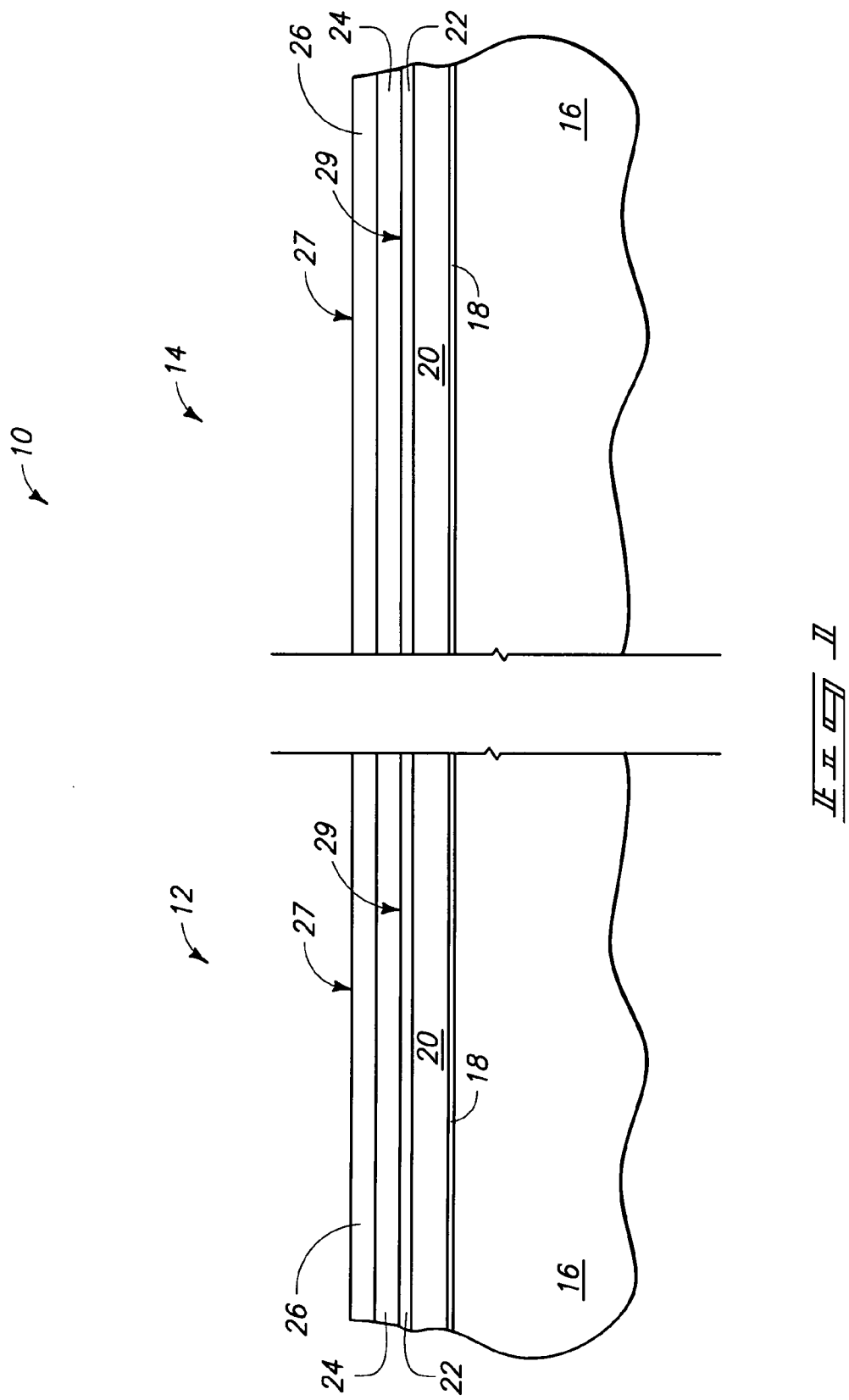
FIG. 1 is a diagrammatic sectional view of an exemplary substrate fragment at a processing step in accordance with an aspect of the invention.

Exemplary methods of fabricating multiple sets of field effect transistors are described with reference to FIGS. 1-9. Referring initially to FIG. 1, a substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. FIG. 1 depicts two exemplary substrate areas 12 and 14 within which different sets of field effect transistors are to be fabricated. Substrate 10 is depicted as comprising a bulk monocrystalline silicon substrate 16. Any other substrate, for example semiconductor-on-insulator, whether existing or yet-to-be developed, is also of course contemplated.

A gate dielectric layer 18 is formed over substrate 16. An exemplary material is silicon dioxide grown or otherwise deposited to an exemplary thickness range of from 1 nm to 5 nm. A polysilicon layer 20 is formed over gate dielectric layer 18. An exemplary thickness range is from 10 nm to 200 nm. Polysilicon layer 20 might be in situ doped as-deposited or conductively doped later or separately relative to the exemplary areas 12 and 14. An exemplary refractory metal or metal silicide layer 22 may be formed over polysilicon layer 20. An exemplary material is tungsten or tungsten silicide, deposited to an exemplary thickness range of from 10 nm to 100 nm. An insulative capping layer 24 is formed over conductive gate layer 22/20. Exemplary preferred materials are silicon dioxide and silicon nitride, with an exemplary thickness range being from 50 nm to 200 nm.

An etch stop layer 26 is formed over insulative capping layer 24. In certain implementations, etch stop layer 26 might ultimately be completely removed from the substrate. In certain implementations, etch stop layer 26 might partially remain as part of the finished circuitry construction. Accordingly, etch stop layer 26 might be fabricated to be electrically insulative or electrically conductive depending upon these or other factors. In one exemplary embodiment, the etch stop layer comprises at least one of an elemental metal, a metal alloy and a metal compound. In one exemplary preferred implementation, etch stop layer 26 can be considered as being formed to a first thickness, with an exemplary preferred range for such thickness being from 100 Angstroms to 400 Angstroms. One specific preferred example is a thickness of 200 Angstroms. Further by way of example only, exemplary materials for etch stop layer 26 include silicon dioxide, silicon nitride, titanium nitride, aluminum oxide and silicon carbide, including combinations of these or other materials. Etch stop layer 26 can be characterized as being at least partly different in composition from insulative capping layer 24. In one exemplary preferred embodiment, one of the etch stop layer and the insulative capping layer consists essentially of silicon dioxide, and the other of the etch stop layer and the insulative capping layer consists essentially of silicon nitride. For purposes of the continuing discussion, etch stop layer 26 can be considered as having an elevationally outermost surface 27, and conductive gate layer 22/20 can be considered as having an outermost surface 29. Preferably and by way of example only, such are illustrated as being planar.

Figure 2:
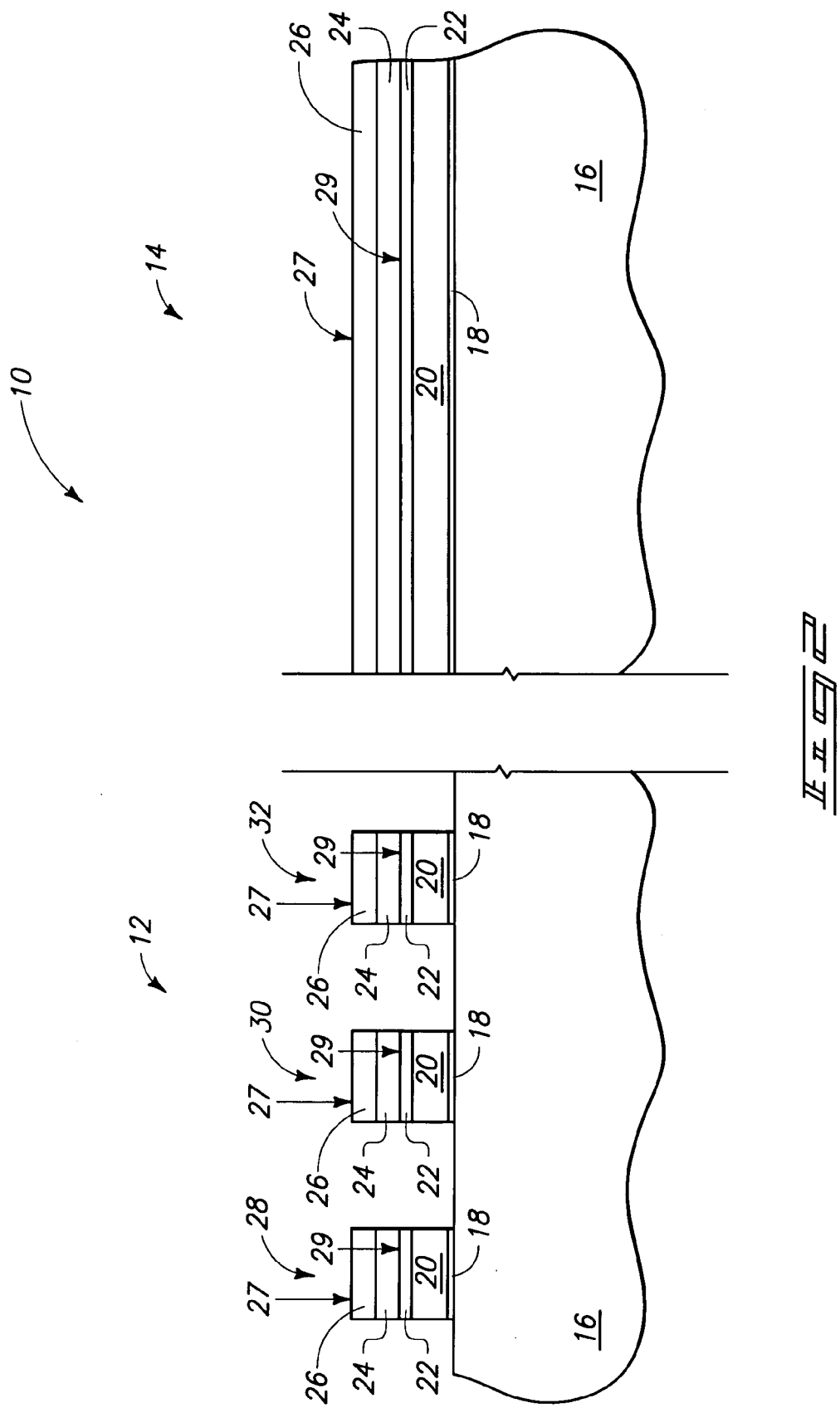
FIG. 2 is a view of the FIG. 1 substrate at a processing step subsequent to that shown by FIG. 1.

Referring to FIG. 2, etch stop layer 26, insulative capping layer 24 and conductive gate layer 22/20 have been patterned and etched to form a first set of conductive gate constructions 28, 30 and 32. An exemplary and preferred existing technique for conducting such patterning is photolithography, for example using conventional or yet-to-be developed photoresists.

Figure 3:
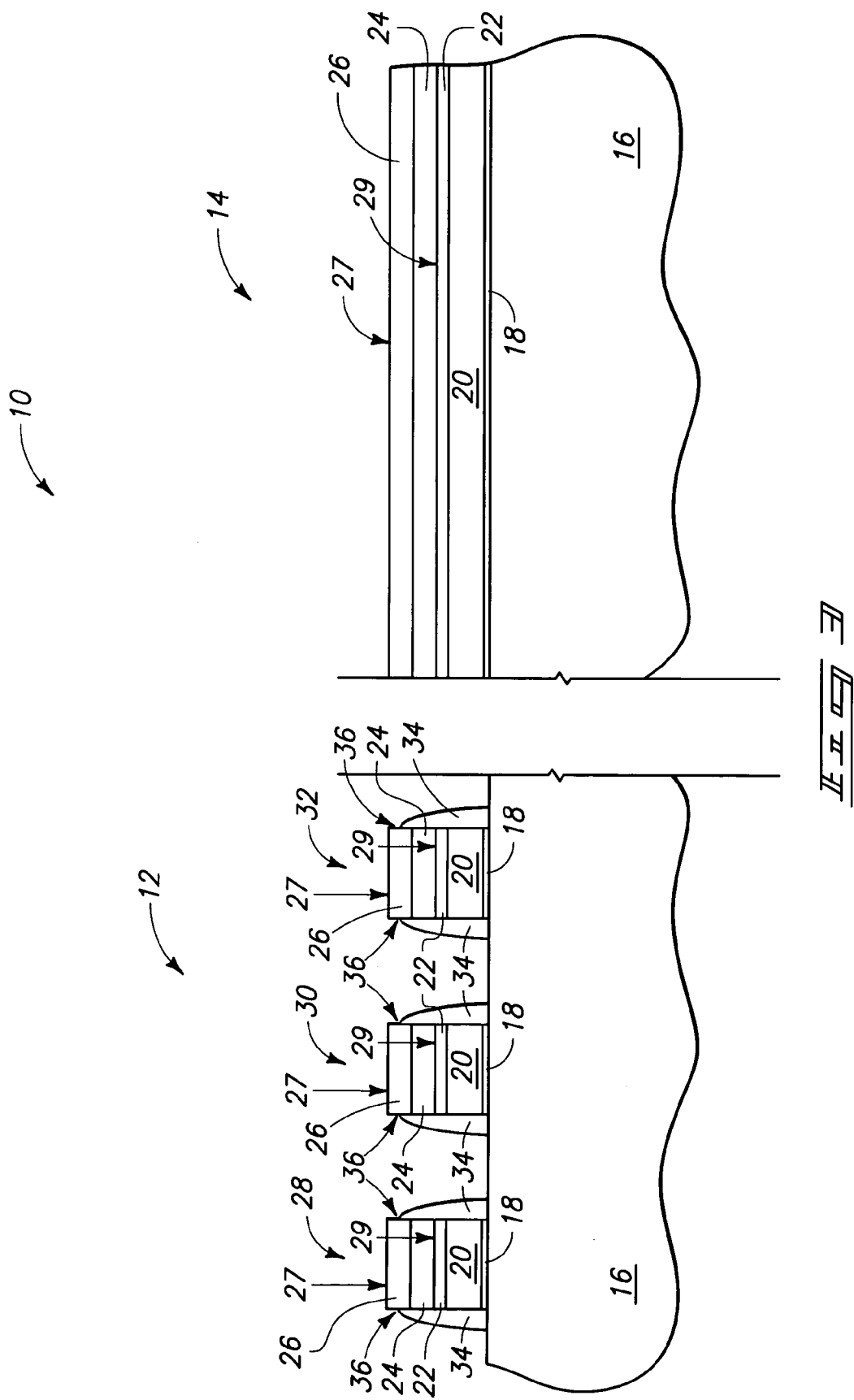
FIG. 3 is a view of the FIG. 2 substrate at a processing step subsequent to that shown by FIG. 2.

Referring to FIG. 3, an insulative spacer forming layer has been formed (typically by depositing) over the substrate, and anisotropically etched to form insulative spacers 34. By way of example only, such are depicted as being received about opposing sidewalls of each of gates 28, 30 and 32. Typically, spacers (not shown) would also be formed over lateral-most edges of the mass of layers 18, 20, 22, 24 and 26 relative to area 14. The spacer forming layer is most preferably of a composition having considerably different etch characteristics during the anisotropic etching as compared to etch stop layer 26. Accordingly, etch stop layer 26 to at least some degree restricts the etching of insulative capping layer 24 during such anisotropic etching which forms the spacers. Some amount of etch stop layer 26 might also be removed during the anisotropic etching. Etch stop layer 26 can be the same or different in composition as insulative capping layer 24.

In the depicted preferred embodiment, a degree of over-etching of the insulative spacer forming layer has been conducted relative to etch stop layer 26 to form spacers 34 to have elevationally outermost surfaces 36 which are elevationally lower than elevationally outermost surfaces 27 of etch stop layer 26. Further in the depicted preferred embodiment, elevationally outermost surfaces 36 of spacers 34 are elevationally higher than elevationally outermost surfaces 29 of conductive gate layer 22/20. In certain implementations, the invention also contemplates fabrication without necessarily forming the depicted spacers. Source/drain regions, halo/pocket implants (none of which are shown) would preferably be fabricated in connection with the FIGS. 2 and/or 3 constructions.

Figure 4:
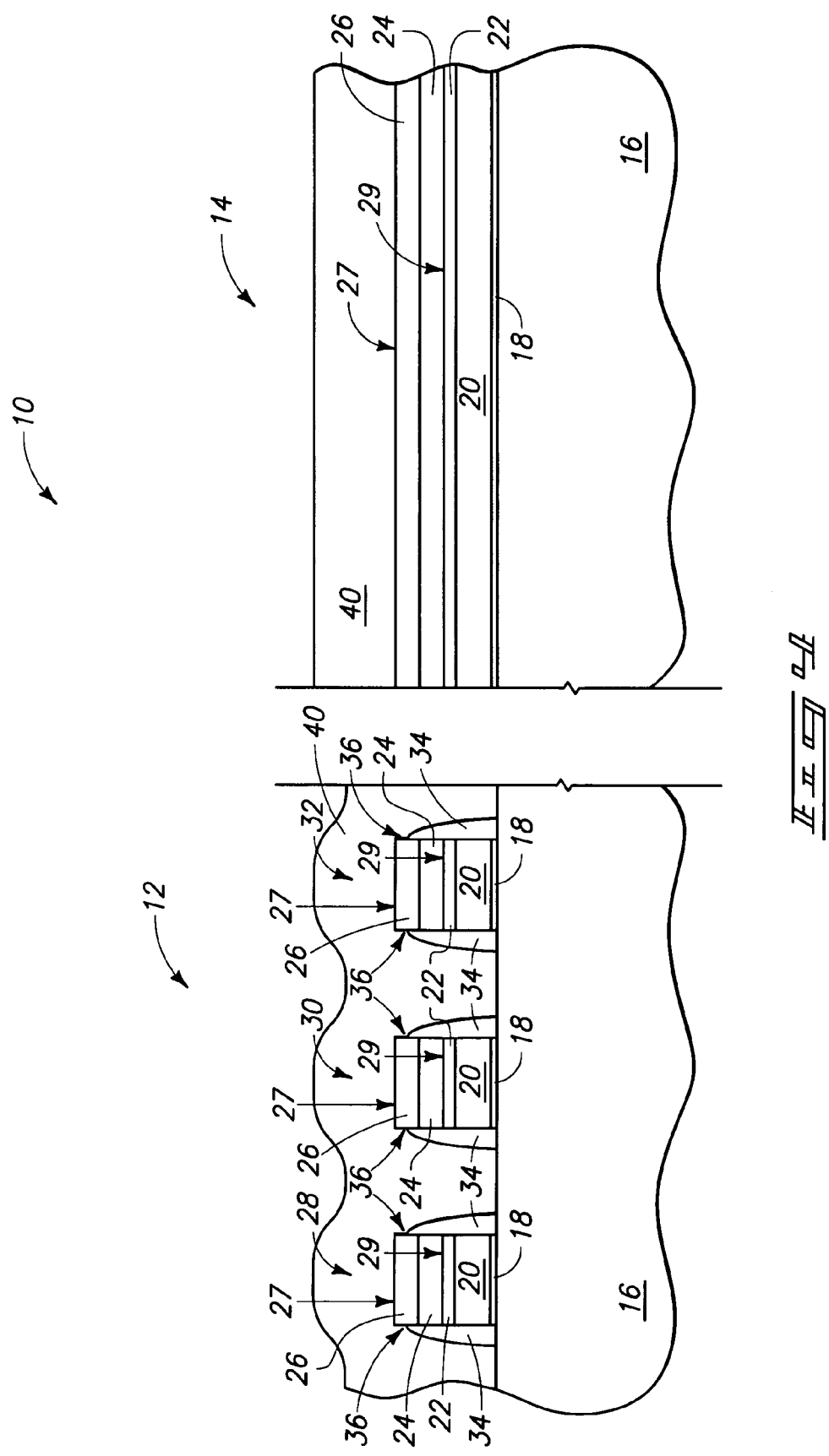
FIG. 4 is a view of the FIG. 3 substrate at a processing step subsequent to that shown by FIG. 3.

Referring to FIG. 4, a dielectric material 40 is formed over substrate 10, and accordingly, also over the first set of gate constructions 28, 30 and 32. An exemplary and preferred material is doped silicon dioxide, for example borophosphosilicate glass (BPSG). An exemplary deposition thickness is from 100 nm to 700 nm.

Figure 5:
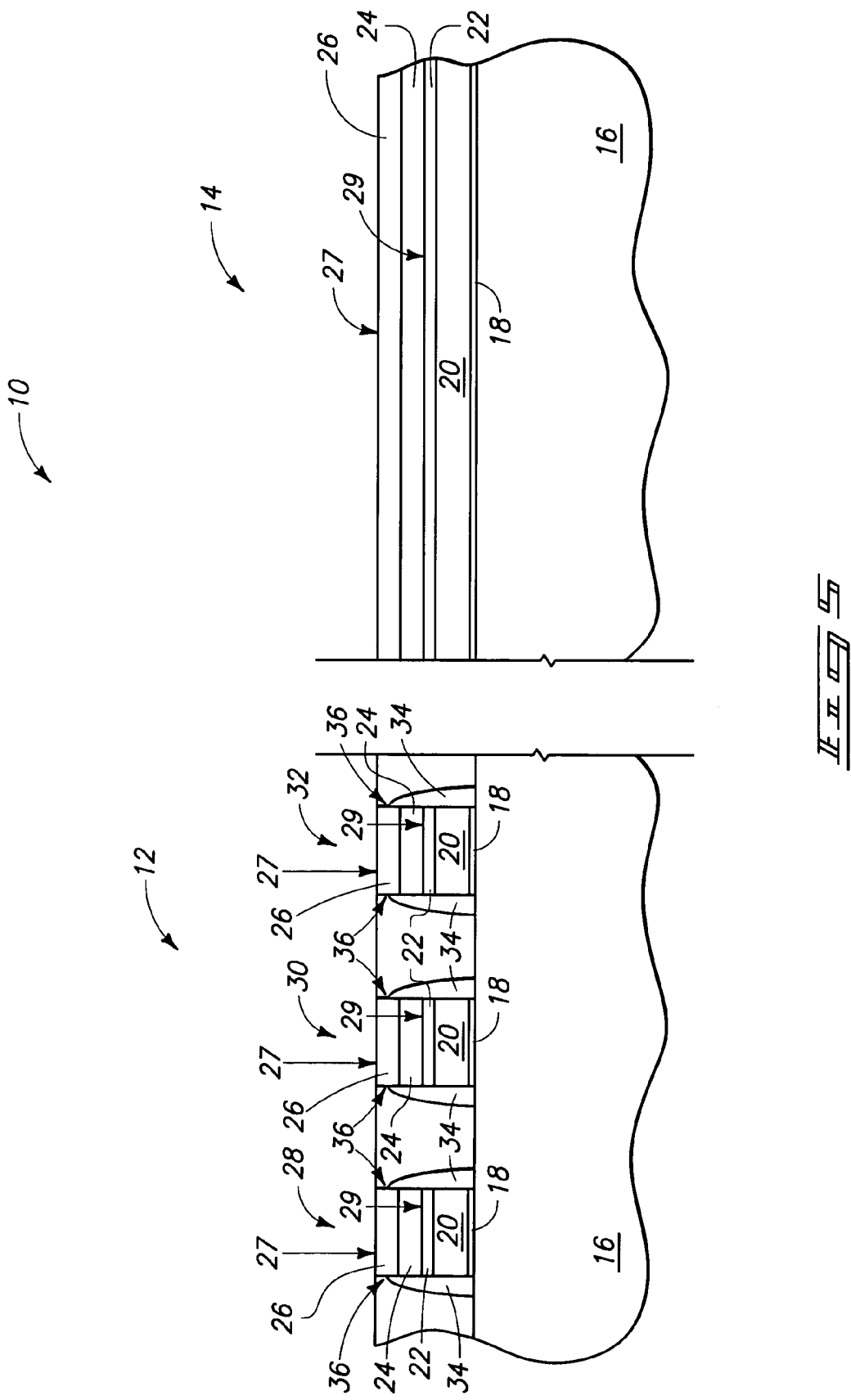
FIG. 5 is a view of the FIG. 4 substrate at a processing step subsequent to that shown by FIG. 4.

Referring to FIG. 5, the dielectric material has been planarized. In one exemplary and illustrated aspect, the planarizing is preferably to at least etch stop layer 26, thereby exposing the same. Such planarizing might also, and would probably typically, remove at least some, if not most, of etch stop layer 26. An exemplary preferred planarizing technique is chemical-mechanical polishing (CMP).

Figure 6:
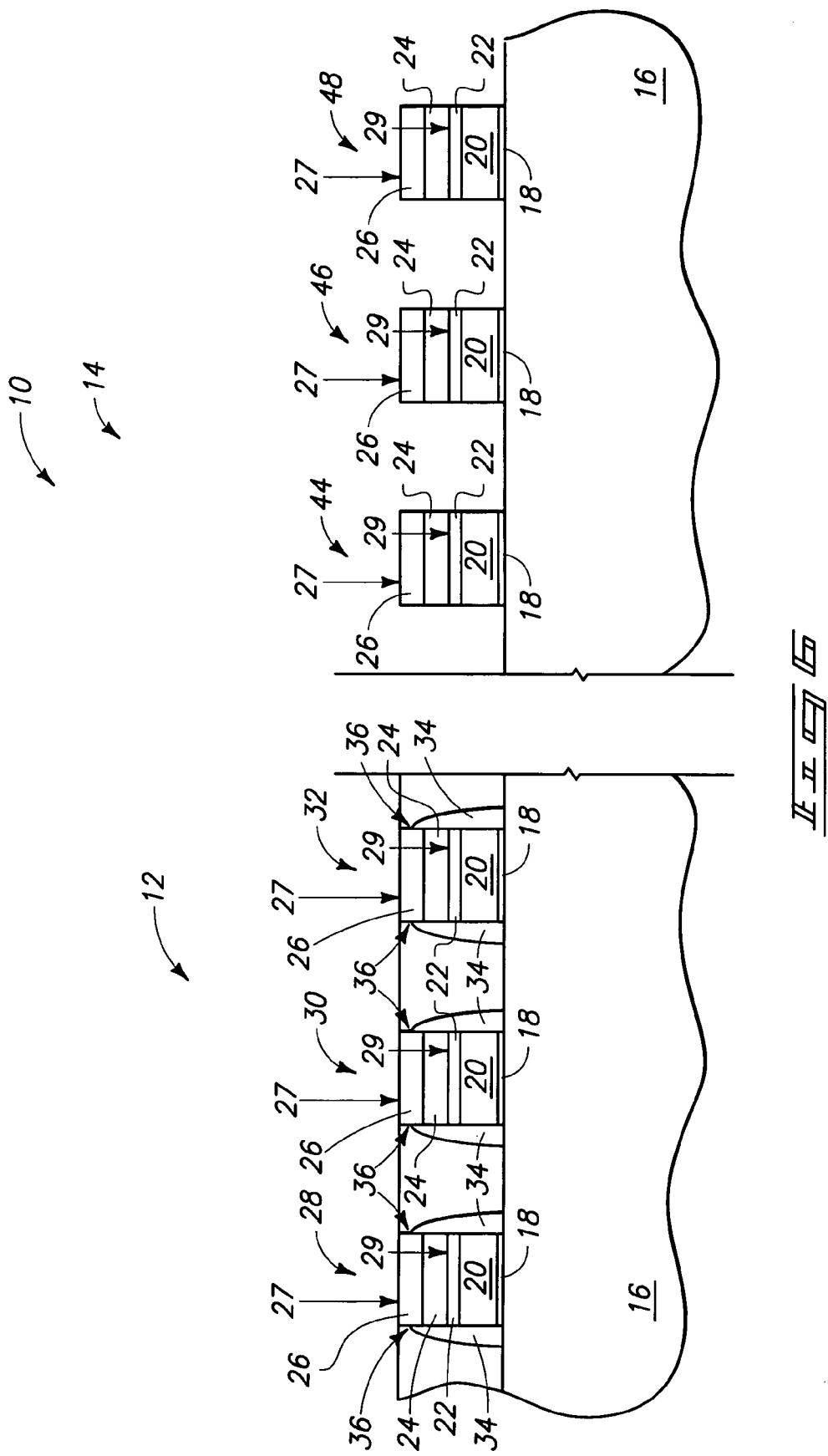
FIG. 6 is a view of the FIG. 5 substrate at a processing step subsequent to that shown by FIG. 5.

Referring to FIG. 6, insulative capping layer 26 and conductive gate layer 22/20 have been patterned and etched to form a second set of conductive gate constructions 44, 46 and 48 over substrate 10. An exemplary preferred method for conducting the patterning is utilizing photolithography, for example using a photoresist which entirely masks area 12 and only masks a portion of area 14 effective for the etching to form the illustrated gate constructions. In the exemplary depicted FIGS. 1-6 embodiment, remnant etch stop layer 26 remains in area 14 to an extent that the patterning and etching just described are also conducted relative to etch stop layer 26 within area 14 such that it constitutes a portion of the second set of conductive gate constructions 44, 46 and 48.

Of course, the above processing might be repeated on other areas of the wafer, as dictated by the circuitry construction or the artisan. For example, another area of the wafer might be further processed after the depicted FIG. 6 construction by the patterning and etching of the insulative capping layer and the conductive gate layer to form a third set of conductive gate constructions, for example like any of the gate constructions depicted in FIG. 6. Further and regardless, if desired, another insulative spacer forming layer, the same or different in composition from the first, can be formed and anisotropically etched over the second set of conductive gate constructions effective to form insulative spacers thereover (not shown), with the etch stop layer restricting etching of the insulative capping layer during such anisotropic etching. Source/drain regions (not shown)

would also be formed relative to gate constructions 44, 46 and 48. Thereafter, another dielectric material might be formed and planarized over the second set of gate constructions, for example the same or different in composition as the material and processings depicted relative to exemplary BPSG layer 40 in FIGS. 4 and 5. Then, the insulative capping layer and the conductive gate layer might be patterned and etched to form a third set of conductive gate constructions over the substrate.

Figure 7:
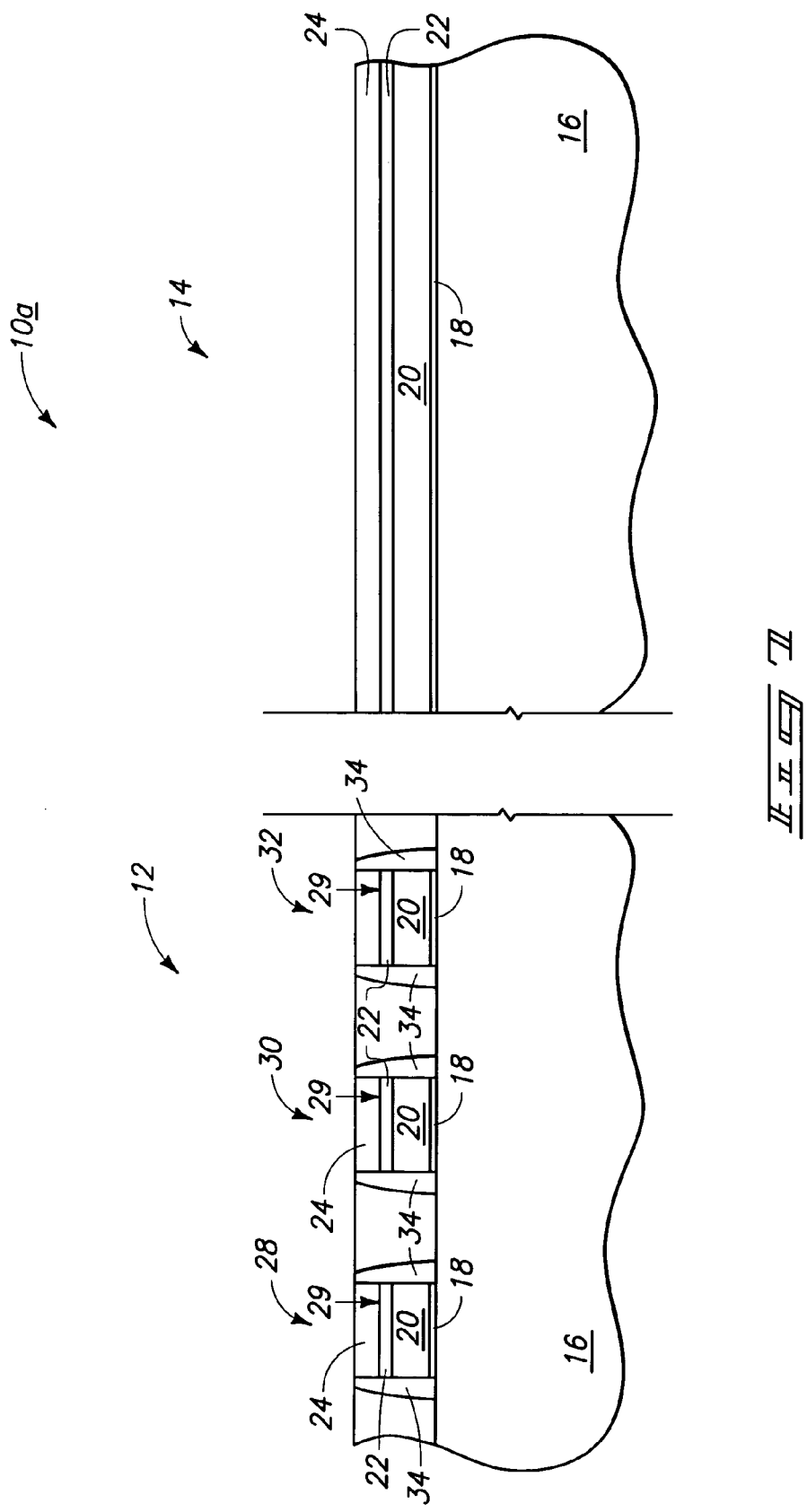
FIG. 7 is a diagrammatic sectional view of an alternate embodiment exemplary substrate fragment at an alternate processing step in accordance with an aspect of the invention.

By way of example only, an alternate embodiment processing is described with reference to FIG. 7-9. Like numerals from the first-described embodiment have been utilized where appropriate, with differences being indicated with the suffix "a" or with different numerals. FIG. 7 depicts a substrate 10a at a processing step corresponding in sequence to that of FIG. 5, or subsequent thereto. FIG. 7 is the same as FIG. 5 but for the planarizing of layer 40 having been conducted effective to remove all remaining etch stop layer 26 from the substrate during the planarizing. Accordingly, such provides but one exemplary alternate or additional processing whereby all remaining etch stop layer is ultimately removed from the substrate. Processing can then otherwise proceed as described above, for example with respect to FIG. 6, to produce another set of field effect transistor gate constructions.

Figure 8:
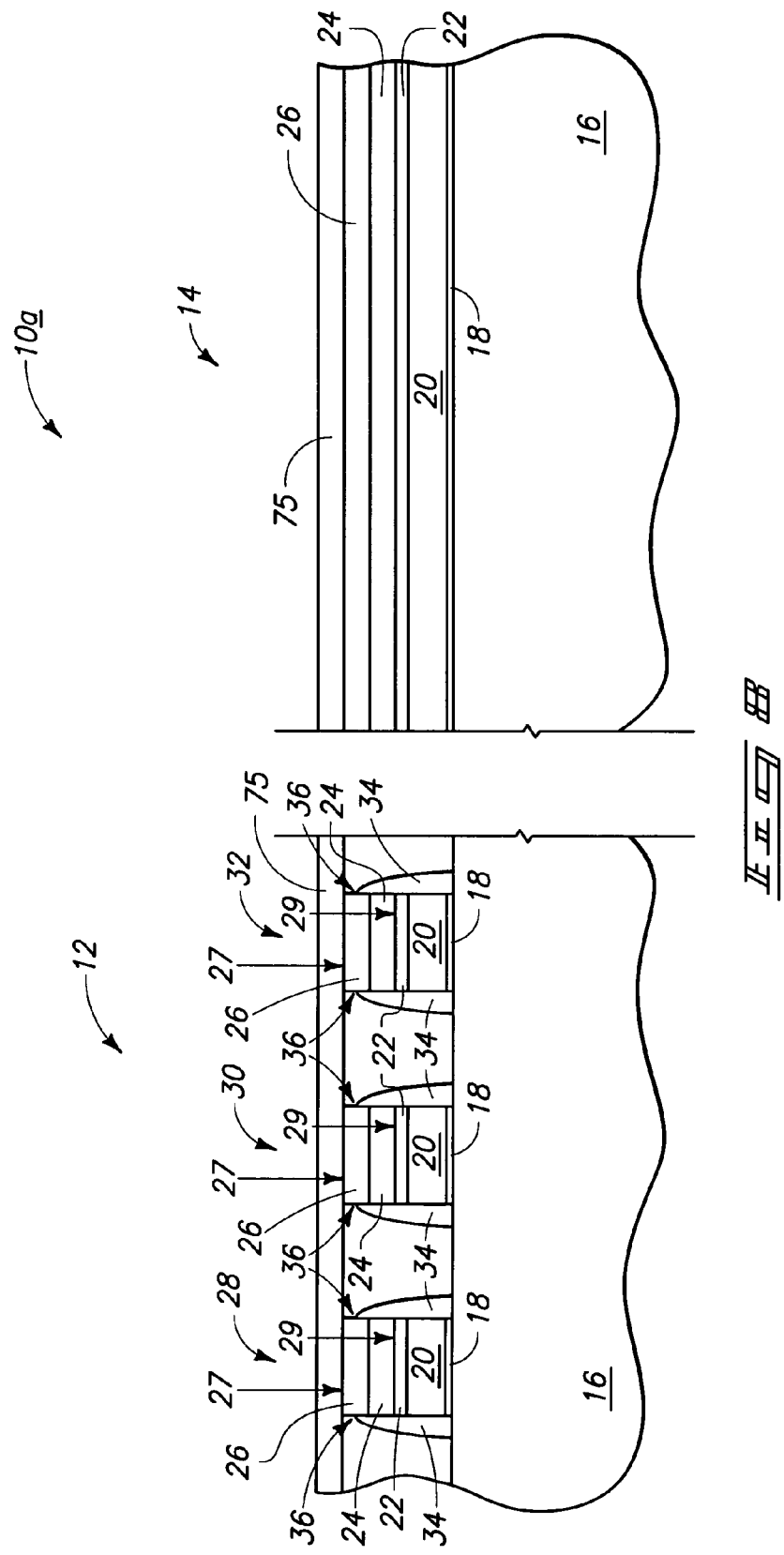
FIG. 8 is a view of the FIG. 7 substrate at a processing step subsequent to that shown by FIG. 7.

Yet in one exemplary preferred embodiment, FIG. 8 depicts processing subsequent to that of FIG. 7 whereby a mass of material 75 has been formed over the substrate to a second thickness which is preferably within ten percent of the first thickness of etch stop layer 26. More preferably, the second thickness is within five percent of the first thickness, and even more preferably within one percent of the first thickness. By way of example only, a goal or desire may be to arrive at a precisely controlled thickness roughly the same as that conducted during the photolithographic processing to produce the first set of transistor gates. Accordingly, the processor/designer may want to completely remove the etch stop layer and redeposit it (or another composition material) to roughly or exactly match the same thickness as the first formed etch stop layer, thereby facilitating precise processing in that the thickness of the underlying layers being etched to produce the second or subsequent field effect transistor gates are very close to being-the same as the first.

Figure 9:
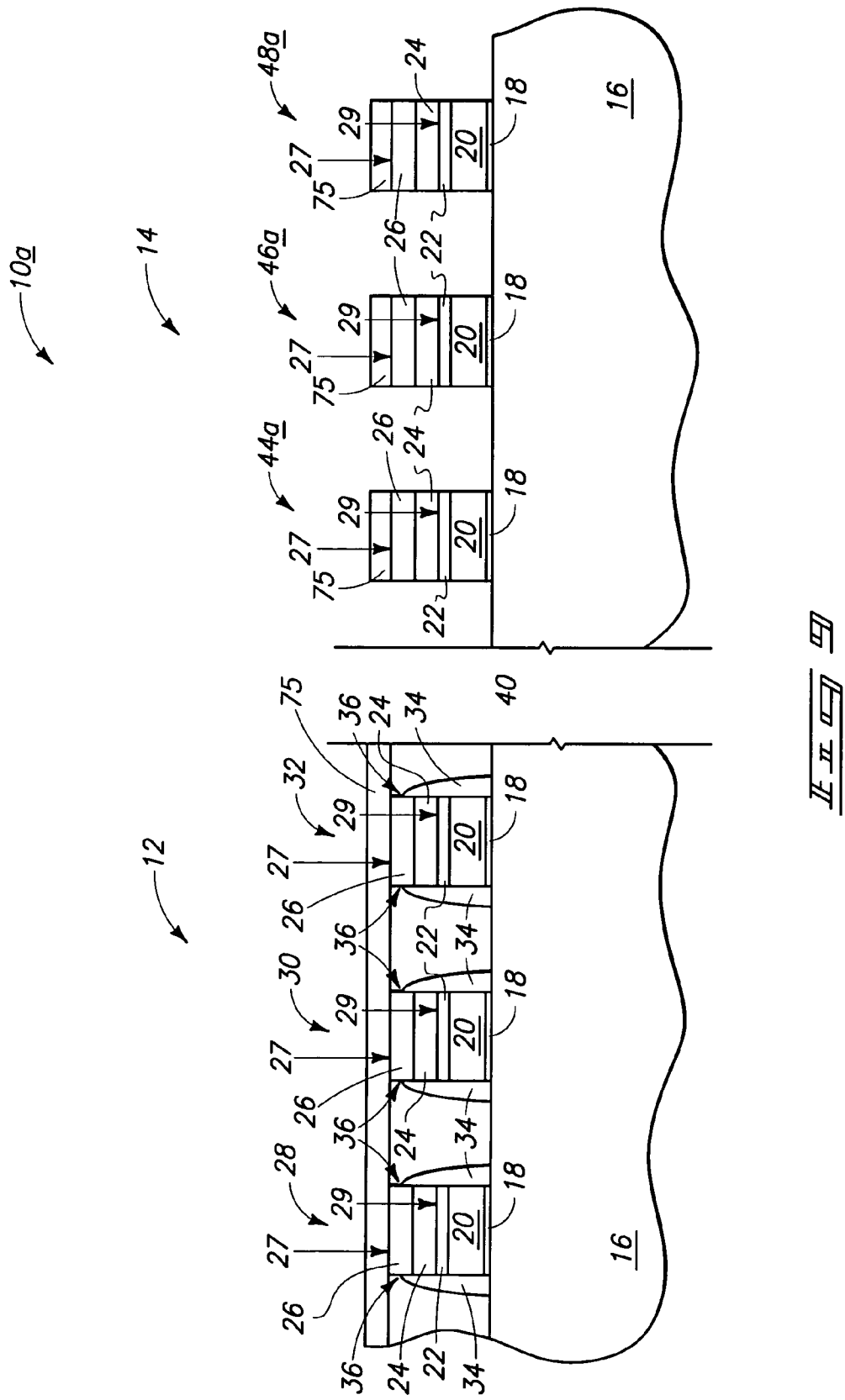
FIG. 9 is a view of the FIG. 8 substrate at a processing step subsequent to that shown by FIG. 8.

Referring to FIG. 9, mass of material 75, insulative capping layer 24 and conductive gate layer 22/20 have been patterned and etched effective to form a second set of conductive gate constructions 44a, 46a and 48a over substrate 10. Of course, depending on the composition of mass of material 75, such might remain or ultimately be removed from the substrate. Exemplary preferred materials for material 75 are the same as that of etch stop layer 26. Such may or may not remain in the finished circuitry construction.

Of course, other processing may be conducted in connection with the above, prior thereto, or subsequent thereof, but is not particularly germane to the claimed invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of fabricating multiple sets of field effect transistors, comprising:
    forming a series of layers over a semiconductor substrate comprising silicon; the series comprising a conductive gate layer, an insulative layer over the conductive gate layer, and an etch stop layer over the insulative layer, the etch stop layer being formed to a first thickness;
    patterning and etching the series of layers to form a first set of gate constructions over a first area of the substrate;
    depositing and etching insulative material effective to form insulative sidewall spacers over sidewalls of the first set of gate constructions, the etch stop layer restricting etching of the insulative layer during the etching of the insulative material;
    after forming the insulative sidewall spacers, forming and planarizing a dielectric material over the first set of gate constructions, and effective to remove all remaining of the etch stop layer from the substrate during said planarizing;
    after forming and planarizing the dielectric material, forming a mass of material over the substrate to a second thickness which is within ten percent of the first thickness; and
    after forming and planarizing the dielectric material, patterning and etching the mass of material, the insulative layer and the conductive gate layer to form a second set of gate constructions over a second area of the substrate.

2. The method of claim 1 wherein the second thickness is within five percent of the first thickness.

3. The method of claim 1 wherein the second thickness is within one percent of the first thickness.

4. The method of claim 1 wherein the etch stop layer is electrically insulative.

5. The method of claim 1 wherein the etch stop layer is electrically conductive.

6. The method of claim 1 wherein the etch stop layer and the insulative layer are of different compositions.

7. A method of fabricating multiple sets of field effect transistors, comprising:
    forming a series of layers over a semiconductor substrate comprising silicon; the series comprising a conductive gate layer, an insulative layer over the conductive gate layer, and an etch stop layer over the insulative layer;
    patterning and etching the series of layers to form a first set of gate constructions over a first area of the substrate;
    forming and planarizing a dielectric material over the first set of gate constructions, the planarizing comprising removing all remaining of said etch stop layer from the substrate; and
    after forming and planarizing the dielectric material, patterning and etching the insulative layer and the conductive gate layer to form a second set of gate constructions over a second area of the substrate.

8. The method of claim 7 wherein the etch stop layer and the insulative layer are of different compositions.

9. A method of fabricating multiple sets of field effect transistors, comprising:
    forming a series of layers over a semiconductor substrate comprising silicon; the series comprising a conductive gate layer, an insulative layer over the conductive gate layer, and an etch stop layer over the insulative layer, the etch stop layer and the insulative layer each being insulative and of different compositions;

patterning and etching the series of layers to form a first set of gate constructions over a first area of the substrate;

depositing and etching insulative material effective to form insulative sidewall spacers over sidewalls of the first set of gate constructions, the etch stop layer restricting etching of the insulative layer during the etching of the insulative material, the etching forming the spacers to have elevationally outermost surfaces which are elevationally lower than elevationally outermost surfaces of the etch stop layer and which are elevationally higher than elevationally innermost surfaces of the etch stop layer;

after forming the insulative spacers, forming and planarizing a dielectric material over the first set of gate constructions; and after forming and planarizing the dielectric material, patterning and etching the insulative layer and the conductive gate layer to form a second set of gate constructions over a second area of the substrate.

10. The method of claim 9 further comprising:

after the patterning and etching of the insulative layer and the conductive gate layer to form the second set of gate constructions, depositing and etching insulative material over the second set of gate constructions effective to form insulative sidewall spacers over sidewalls of the second set of gate constructions, the etch stop layer restricting etching of the insulative layer during the etching of said insulative material received over the second set of gate constructions;

after forming the insulative sidewall spacers over the second set of gate constructions, forming and planarizing dielectric material over the second set of gate constructions; and after forming and planarizing the dielectric material over the second set of gate constructions, patterning and etching the insulative layer and the conductive gate layer to form a third set of gate constructions over a third region of the substrate.

11. The method of claim 9 wherein the planarizing is to at least the etch stop layer.

12. The method of claim 9 wherein the planarizing is to and removes at least some of the etch stop layer.

13. The method of claim 9 wherein at least some of said etch stop layer remains as part of the substrate in a finished circuitry construction including said multiple sets of field effect transistors.

14. The method of claim 9 wherein the etch stop layer is initially formed to from 100 Angstroms to 400 Angstroms thick.

15. The method of claim 9 wherein the patterning and etching the insulative layer and the conductive gate layer to form the second set of gate constructions also patterns and etches remnant of the etch stop layer to constitute a portion of the second set of gate constructions.

16. The method of claim 9 wherein the patterning and etching to form the second set of gate constructions over the substrate also etches through the etch stop layer.

17. A method of fabricating multiple sets of field effect transistors, comprising:

forming a series of layers over a semiconductor substrate comprising silicon; the series comprising a conductive gate layer, an insulative layer over the conductive gate layer, and an etch stop layer over the insulative layer;

patterning and etching the etch stop layer, the insulative layer, and the conductive gate layer to form a first set of gate constructions over a first area of the substrate;

forming and planarizing a dielectric material over the first set of gate constructions;

after forming and planarizing the dielectric material, patterning and etching the insulative layer and the conductive gate layer to form a second set of gate constructions over a second area of the substrate; and wherein the etch stop layer comprises at least one of a conductive metal alloy and a conductive compound.

18. The method of claim 17 wherein the etch stop layer comprises a conductive metal alloy.

19. The method of claim 17 wherein the etch stop layer comprises a conductive metal compound.

20. A method of fabricating multiple sets of field effect transistors, comprising:

forming a series of layers over a semiconductor substrate comprising silicon; the series comprising a conductive gate layer, an insulative layer over the conductive gate layer, and an etch stop layer over the insulative layer;

patterning and etching the series of layers to form a first set of gate constructions over a first area of the substrate;

depositing and etching insulative material effective to form insulative sidewall spacers over sidewalls of the first set of gate constructions, the etch stop layer restricting etching of the insulative layer during the etching of the insulative material;

after forming the insulative sidewall spacers, forming and planarizing a dielectric material over the first set of gate constructions;

after forming and planarizing the dielectric material, patterning and etching the insulative layer and the conductive gate layer to form a second set of gate constructions over a second area of the substrate; and wherein the etch stop layer comprises at least one of a conductive metal alloy and a conductive metal compound.

21. The method of claim 20 wherein the patterning and etching to form the second set of gate constructions also etches through the etch stop layer.

22. The method of claim 20 wherein the etch stop layer comprises a conductive metal alloy.

23. The method of claim 20 wherein the etch stop layer comprises a conductive metal compound.

24. A method of fabricating multiple sets of field effect transistors, comprising:

forming a series of layers over a semiconductor substrate comprising silicon; the series comprising a conductive gate layer, an insulative layer over the conductive gate layer, and an etch stop layer over the insulative layer, the etch rstop layer and the insulative layer each being of different compositions;

patterning and etching the series of layers to form a first set of gate constructions over a first area of the substrate;

forming and planarizing a dielectric material over the first set of gate constructions;

after forming and planarizing the dielectric material, patterning and etching the insulative layer and the conductive gate layer to form a second set of gate constructions over a second area of the substrate; and wherein the patterning and etching the insulative layer and the conductive gate layer to form the second set of gate constructions also patterns and etches remnant of the etch stop layer to constitute a portion of the second set of gate constructions.

25. The method of claim 24 wherein the planarizing is to at least the etch stop layer.

26. The method of claim 24 wherein the planarizing is to and removes at least some of the etch stop layer.

27. The method of claim 24 wherein at least some of said etch stop layer remains as part of the substrate in a finished circuitry construction including said multiple sets of field effect transistors.

28. The method of claim 24 wherein the etch stop layer is electrically insulative.

29. The method of claim 24 wherein the etch stop layer is initially formed to from 100 Angstroms to 400 Angstroms thick.

30. The method of claim 24 further comprising after the patterning and etching of the insulative layer and the conductive gate layer to form the second set of gate constructions, patterning and etching of the insulative layer and the conductive gate layer to form a third set of gate constructions over a third area of the substrate.

* * * * *

UNITED STATES PATENT AND TRADEMARK OFFICE
CERTIFICATE OF CORRECTION

| | | |
|---|---|---|
| PATENT NO. | : 7,368,372 B2 | Page 1 of 1 |
| APPLICATION NO. | : 11/386167 | |
| DATED | : May 6, 2008 | |
| INVENTOR(S) | : Fishburn et al. | |

It is certified that error appears in the above-identified patent and that said Letters Patent is hereby corrected as shown below:

On the face page, in field (74), in "Attorney, Agent, or Firm", in column 2, line 1, delete "Well" and insert -- Wells --, therefor.

In column 8, line 55, in Claim 24, delete "rstop" and insert -- stop --, therefor.

Signed and Sealed this

Nineteenth Day of August, 2008

JON W. DUDAS
*Director of the United States Patent and Trademark Office*